(12) United States Patent
Kim et al.

(10) Patent No.: US 6,444,559 B2
(45) Date of Patent: Sep. 3, 2002

(54) METHOD FOR FABRICATING SEMICONDUCTOR DEVICE

(75) Inventors: Jeong Ho Kim; Yu Chang Kim, both of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 32 days.

(21) Appl. No.: 09/741,880

(22) Filed: Dec. 22, 2000

(30) Foreign Application Priority Data

Dec. 24, 1999 (KR) .............................. 99-61848

(51) Int. Cl.⁷ ..................... H01L 21/44; H01L 21/336
(52) U.S. Cl. .................. 438/601; 438/675; 438/197; 438/284; 438/787; 438/597
(58) Field of Search ................. 438/601, 299, 438/612, 618, 397, 253, 256, 339, 279, 300, 303, 284, 597, 607, 197, 704, 706, 675, 595, 652, 655, 787

(56) References Cited

U.S. PATENT DOCUMENTS 6,177,320 B1 * 1/2001 Cho et al. ................... 438/279
6,204,161 B1 * 3/2001 Chung et al. ................ 438/612
6,242,332 B1 * 6/2001 Cho et al. ................... 438/587
6,268,252 B1 * 7/2001 Lee et al. ................... 438/299
6,287,905 B2 * 9/2001 Kim et al. ................... 438/197
6,337,275 B1 * 1/2002 Cho et al. ................... 438/675

* cited by examiner

Primary Examiner—Caridad Everhart
Assistant Examiner—Igwe U. Anya
(74) Attorney, Agent, or Firm—Pillsbury Winthrop LLP

(57) ABSTRACT

The present invention discloses a method for fabricating a semiconductor device. In a process for forming a contact plug, a pad polycrystalline silicon layer pattern is formed at the presumed contact region, and a contact plug is formed according to a selective epitaxial growth (SEG) method using the pad polycrystalline silicon layer pattern as a seed. Accordingly, a higher contact plug is formed by improving a growth rate of the SEG process, and thus a succeeding process can be easily performed. In the SEG process, a contact property is improved by compensating for a semiconductor substrate damaged in a process for forming an insulating film spacer at the sidewalls of a gate electrode. As a result, the property and yield of the semiconductor device are remarkably improved.

14 Claims, 4 Drawing Sheets

METHOD FOR FABRICATING SEMICONDUCTOR DEVICE

BACKGROUND OF THE INVENTION

1. Field of the Invention

The present invention relates to a method for fabricating a semiconductor device, and in particular to a method for forming a pad polycrystalline silicon layer pattern at a presumed region of a contact plug for a high integration device, and forming the contact plug according to a selective epitaxial growth (SEG) method using the pad polycrystalline silicon layer pattern as a seed.

2. Description of the Background Art

Recently, the high integration of a semiconductor device has been remarkably influenced by the development of techniques for forming a fine pattern. In a method for fabricating the semiconductor device, it is essential to miniaturize a photoresist film pattern used as a mask in an etching or ion implantation process.

Resolution (R) of the photoresist film pattern is proportional to a light source wavelength ($\lambda$) and a process variable (k) of a micro exposure device, and inversely proportional to a numerical aperture (NA) of the exposure device, and is given by:

$$R = k * \lambda / NA$$

Here, in order to improve optical resolution of the micro exposure device, the wavelength of the light source is decreased. For example, resolution of the G-line and i-line micro exposure devices, having wavelengths of 436 nm and 365 nm, respectively is limited to about 0.7 $\mu$m and 0.5 $\mu$m, respectively. Accordingly, the exposure device using a deep ultraviolet (DUV) light having a small wavelength, for example, a KrF laser of 248 nm or an ArF laser of 193 nm, is employed to form a fine pattern less than 0.5 $\mu$m. In addition, in order to improve the resolution, a method for using a phase shift mask as a photo mask has been suggested. A contrast enhancement layer (CEL) method for forming a thin film on a wafer has been suggested for enhancing an image contrast. A tri layer resist (TLR) method has been suggested for positioning an intermediate layer, such as a spin on glass (SOG) film, between two photoresist films. And a silylation method has been suggested for selectively implanting a silicon into an upper portion of a photoresist film.

According to the high integration of the semiconductor device, the size of a contact hole, which connects the upper and lower conductive interconnections, and the space between the contact hole and an adjacent interconnection are decreased, and an aspect ratio which is the ratio of diameter and depth in the contact hole is increased.

The high integration semiconductor device having multi-layer conductive interconnections requires precise alignment of masks in a contact formation process, thereby reducing a process margin.

In order to maintain a space between the contact holes, masks are formed in consideration of: misalignment tolerance in a mask alignment, lens distortion in an exposure process, critical dimension variations in mask formation and photoetching processes, and mask registration between masks.

In addition, there has been taught a self aligned contact (SAC) method for forming a contact hole according to a self alignment method to overcome a disadvantage of a lithography process.

The SAC method uses a polycrystalline silicon layer, a nitride film or an oxide nitride film as an etching barrier film. In general, the nitride film is employed as the etching barrier film.

Although not illustrated, the conventional SAC method for fabricating the semiconductor device will now be described.

Firstly, a substructure consisting of, for example, a device isolating insulating film, a gate insulating film and a metal-oxide semiconductor field effect transistor (MOSFET) having a gate electrode overlapped with a gate insulating film and a mask insulating film pattern, and source/drain regions are formed on a semiconductor substrate. An etching barrier film and an interlayer insulating film consisting of an oxide film are sequentially formed over the whole surface of the structure.

Thereafter, a photoresist film pattern exposing a presumed region for a storage electrode contact or bit line contact on the semiconductor substrate is formed on the upper side of the interlayer insulating film.

The interlayer insulating film exposed by the photoresist film pattern is dry-etched to expose the etching barrier film. Then, a contact hole is formed by etching the etching barrier film.

In the conventional SAC method for fabricating the semiconductor device, the bit line contact and the storage electrode contact are formed according to the SAC method using the nitride film or oxide nitride film. In this case, the contact is formed in a hall or T type.

In the case of the hall type contact, the overlap precision of the lithography process has a limit and the contact hole has a sloped section in the etching process of a planarization film. Thus, it is difficult to obtain a contact region. In order to overcome the disadvantages of the hall type contact, the hall type contact is transformed into the T type contact.

However, to form the T type contact a chemical mechanical polishing (CMP) process is performed several times, thereby increasing fabrication costs. In addition, the CMP process includes a complicated and difficult process for isolating a contact plug, so that it cannot achieve mass-production. Furthermore, a yield of the device is reduced.

Accordingly, there has been suggested a method for forming the contact plug according to a selective epitaxial growth (SEG) method.

However, when an insulating film spacer is formed at the sidewalls of the gate electrode, the semiconductor substrate is damaged, thereby restricting the selective epitaxial growth. That is, a growth rate of a selective epitaxial growth film has a limit. Thus, it is difficult to form the contact plug having a free height.

When the planarization film is etched to form the succeeding bit line contact or storage electrode contact, the contact plug may damage the device isolating film, thereby causing gate induced drain leakage. Accordingly, a property of the device is deteriorated, and simultaneously a yield thereof is reduced.

SUMMARY OF THE INVENTION

Therefore, there is a need to provide a method for fabricating a semiconductor device which can prevent gate induced drain leakage by forming a MOSFET, forming a pad polycrystalline silicon layer pattern at a presumed region of a contact plug, and then forming the contact plug according to a selective epitaxial growth (SEG) method using the pad polycrystalline silicon layer pattern as a seed, and which can improve a contact resistance property and a device operation property by reducing a contact junction leakage current.

Accordingly, the present invention provides a method for fabricating a semiconductor device, the method including: forming an isolating film for defining an active region on a semiconductor substrate; forming a gate insulating film over the whole surface of the structure; forming on the gate insulating film a gate electrode where a mask insulating film pattern is stacked; forming an insulating film spacer at the sidewalls of the gate electrode and the mask insulating film pattern; forming source/drain regions at the both sides of the insulating film spacer on the semiconductor substrate; forming a pad polycrystalline silicon layer pattern at a presumed region for a bit line contact and a storage electrode contact on the semiconductor substrate, and at the sidewalls of the insulating film spacer; forming a contact plug according to a selective epitaxial growth method using the pad polycrystalline silicon layer pattern as a seed; forming a planarization film over the whole surface of the structure; and forming a contact hole by etching the planarization film by using a contact mask for exposing the contact plug as an etching mask.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION

A method for fabricating a semiconductor device in accordance with the present invention will now be described in detail with reference to the accompanying drawings.

Figure 1:
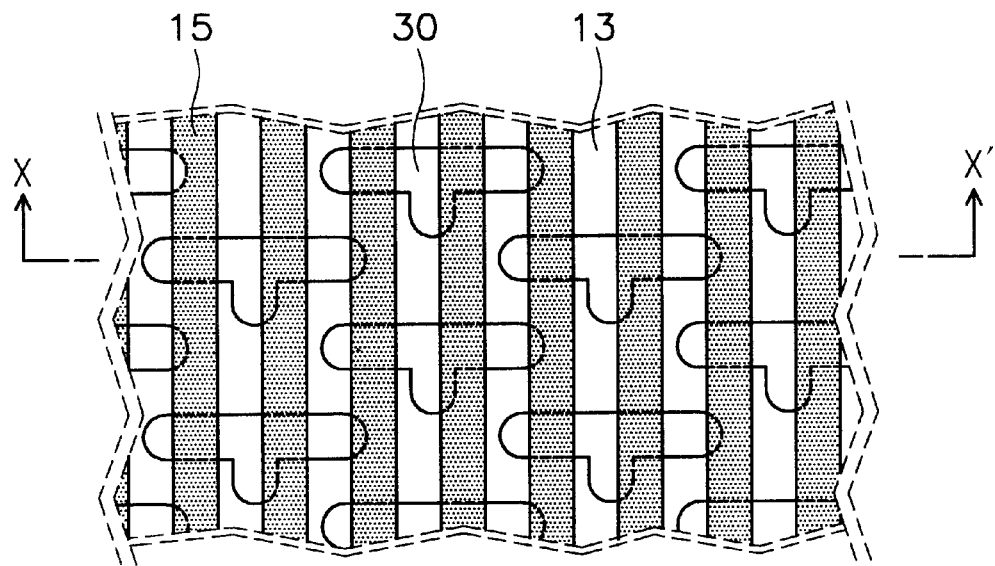
FIG. 1 illustrates a layout of a semiconductor device in accordance with the present invention.

In FIG. 1, active regions 30 are spaced out by an isolating film 13. A plurality of gate electrodes 15 are aligned overlapping the active regions 30.

Figure 2A:
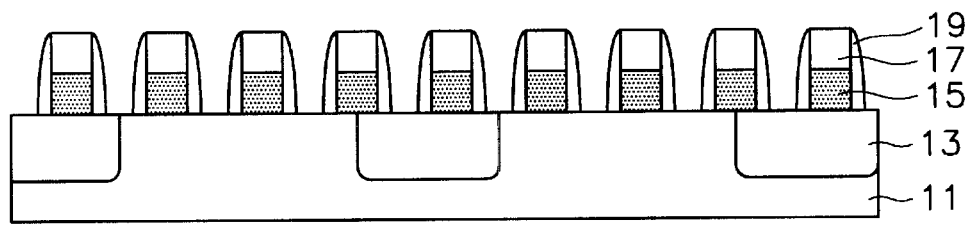
FIG. 2A–FIG. 2F are cross-sectional views respectively illustrating sequential steps of a method for fabricating the semiconductor device, taken along line X-X' in FIG. 1.

In FIG. 2A, the isolating film 13 is formed at a presumed device isolating region of a semiconductor substrate 11, and a gate insulating film (not shown) is formed on the upper side of the whole surface of the resultant structure.

Thereafter, a stacked structure of a gate electrode conductive layer (not shown) and a mask insulating film (not shown) is formed on the gate insulating film.

The stacked structure is etched by using a gate electrode mask as an etching mask, thereby forming a gate electrode 15 and a mask insulating film pattern 17.

An insulating film spacer 19 is formed at the sidewalls of the gate electrode 15 and the mask insulating film pattern 17, by forming an insulating film over the entire structure, and etching the front side of the resultant structure.

Here, the insulating film spacer 19 and the mask insulating film pattern 17 may be one or more films selected from the group consisting of SiN film, SiON film, $Al_2O_3$ film, $Ta_2O_5$ film, SiCH film or SiOH film.

Figure 2B:
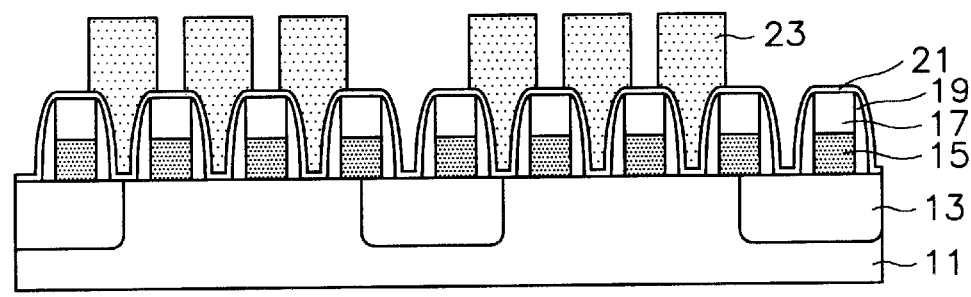

As shown in FIG. 2B, a pad polycrystalline silicon layer 21 having a predetermined thickness is formed over the whole surface of the structure. The pad polycrystalline silicon layer 21 compensates for the semiconductor substrate 11 damaged in the process of forming the insulating film spacer 19, and is used as a seed in a succeeding process for forming a contact plug.

A first photoresist film pattern 23 for protecting the presumed regions of the bit line contact and storage electrode contact is formed at the upper portion of the pad polycrystalline silicon layer 21. At this time, the first photoresist film pattern 23 is formed between the insulating film spacers 19 at the presumed contact region of the semiconductor substrate 11.

Figure 2C:
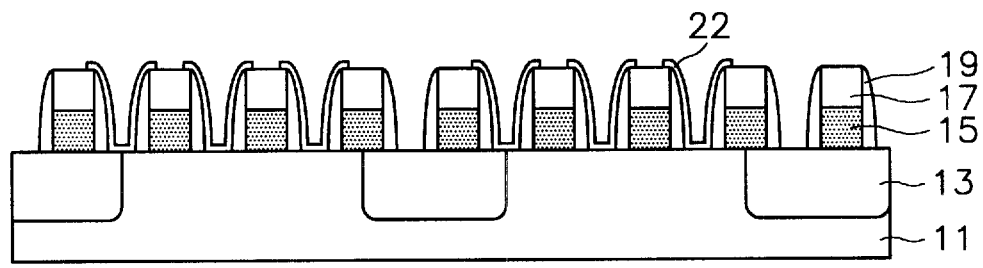

As depicted in FIG. 2C, the pad polycrystalline silicon layer 21 is etched by using the first photoresist film pattern 23 as an etching mask, thereby forming a pad polycrystalline silicon layer 22 at the presumed contact region of the semiconductor substrate 11 and the sidewalls of the insulating film spacer 19. The pad polycrystalline silicon layer 21 is etched according to a wet isotropic etching process using a mixed solution as an etchant, the mixed solution $HNO_3$, $CH_3COOH$, HF and deionized water, or a dry isotropic etching process using a mixed gas as an etchant, the mixed gas comprising a mixture of a main etching gas such as $CF_4$, $SF_6$, $NF_3$ or $C_2F_6$, an oxygen containing gas such as $O_2$, $CO_2$, CO or $SO_2$, and an inert gas such as He, Ne, Ar or Xe.

Next, the first photoresist film pattern 23 is removed.

Figure 2D:
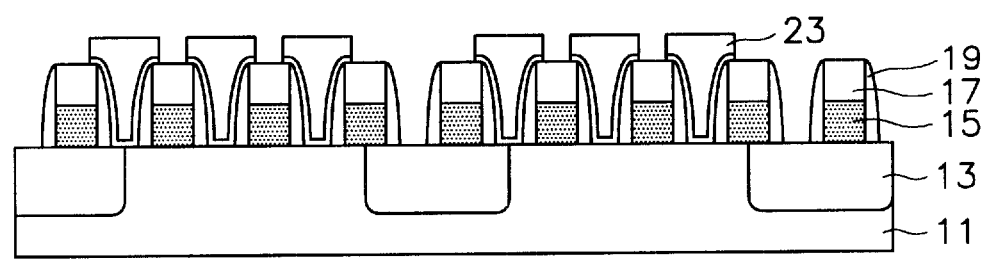

Referring to FIG. 2D, a contact plug 23 is formed by selectively growing an epitaxial silicon layer by using the pad polycrystalline silicon layer pattern 22 as a seed.

Figure 2E:
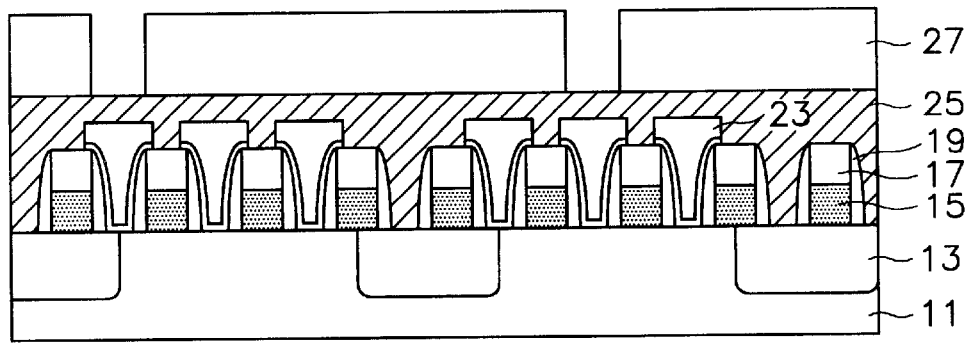

As illustrated in FIG. 2E, a planarization film 25 is formed over the entire surface of the structure.

Next, a second photoresist film pattern 27 for exposing a presumed region of the bit line contact in the contact plug 23 is formed on the planarization film 25.

Figure 2F:
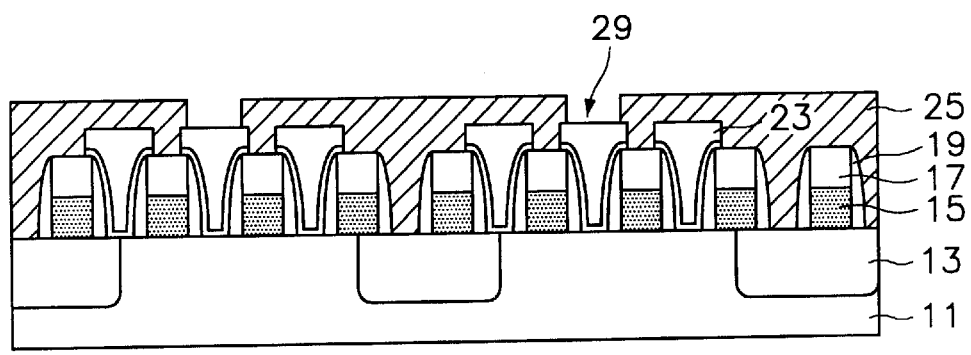

As shown in FIG. 2F, the planarization film 25 is etched by using the second photoresist film pattern 27 as an etching mask, thereby forming a contact hole 29 for exposing the presumed region of the bit line contact in the contact plug 23.

The etching process is performed by using a perfluorocarbon containing gas for generating a large amount of polymers, or a mixed gas of the perfluorocarbon containing gas and a hydrogen containing gas.

The perfluorocarbon containing gas is selected from the group consisting of $C_2F_6$, $C_2F_4$, $C_3F_6$, $C_3F_8$, $C_4F_6$, $C_4F_8$, $C_5F_8$, $C_5F_{10}$ and $C_2HF_5$.

The hydrogen containing gas is selected from the group consisting of $CHF_3$, $CH_3F$, $CH_2F_2$, $CH_2$, $CH_4$, $C_2H_4$ and $H_2$.

The etching process can be performed by adding the inert gas such as He, Ne, Ar or Xe into the perfluorocarbon containing gas and the mixed gas. In this case, an etching stop phenomenon can be overcome by improving the plasma stability and sputtering effects, so that the reproducible etching process can be carried out.

In addition, the etching process can be performed by using CxHyFz gas ($x \geq 2$, $y \geq 2$, $z \geq 2$) as an etching gas, thereby obtaining a high etching selection ratio in regard to the mask insulating film pattern 17 and the insulating film spacer 19. The etching process can be also carried out by using a mixed gas of the CxHyFz gas ($x \geq 2$, $y \geq 2$, $z \geq 2$) and the inert gas as an etching gas.

Next, the second photoresist film pattern 27 is removed.

FIGS. 2A to 2F illustrate the sequential steps of the process for forming the bit line contact hole, which can be applied to the process for forming the storage electrode contact hole.

As described above, in accordance with the method for fabricating the semiconductor device of the present invention, the pad polycrystalline silicon layer pattern is formed at the presumed contact region in the process for forming the contact plug, and the contact plug is formed according to the SEG method using the pad polycrystalline silicon layer pattern as a seed. Accordingly, the higher contact plug is formed by improving the growth rate of the SEG process, and thus a succeeding process can be easily performed. In the SEG process, the contact property is improved by compensating for the semiconductor substrate damaged in the process for forming the insulating film spacer at the sidewalls of the gate electrode. As a result, the property and yield of the semiconductor device can be remarkably improved.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating a semiconductor device, the method comprising:

forming an isolating film for defining an active region on a semiconductor substrate;

forming a gate insulating film over the whole surface of the structure;

forming on the gate insulating film a gate electrode where a mask insulating film pattern is stacked;

forming an insulating film spacer at the sidewalls of the gate electrode and the mask insulating film pattern;

forming source/drain regions at both sides of the insulating film spacer on the semiconductor substrate;

forming a pad polycrystalline silicon layer pattern on the semiconductor substrate where a bit line contact and a storage electrode contact will be formed, and at the sidewalls of the insulating film spacer;

forming a contact plug according to a selective epitaxial growth method using the pad polycrystalline silicon layer pattern as a seed;

forming a planarization film over the whole surface of the structure; and forming a contact hole by etching the planarization film by using a contact mask for exposing the contact plug as an etching mask.

2. The method according to claim 1, wherein the insulating film spacer and the mask insulating film pattern are selected from the group consisting of an SiN film, SiON film, $Al_2O_3$ film, $Ta_2O_5$ film, SiCH film and SiOH film.

3. The method according to claim 1, wherein the pad polycrystalline silicon layer pattern is formed by depositing a pad polycrystalline silicon layer and etching the pad polycrystalline silicon layer according to at least one of a dry and a wet isotropic etching process.

4. The method according to claim 3, wherein the wet isotropic etching process is performed by using a mixed solution as an etchant, the mixed solution comprising $HNO_3$, $CH_3COOH$, HF and deionized water.

5. The method according to claim 3, wherein the dry isotropic etching process is performed by using a mixed gas as an etchant, the mixed gas comprising a mixture of a main etching gas selected from the group consisting of $CF_4$, $SF_6$, $NF_3$, $C_2F_6$ and mixtures thereof, an oxygen containing gas, and an inert gas.

6. The method according to claim 1, wherein the planarization film is etched by using an perfluorocarbon containing gas for generating a large amount of polymers in order to obtain a high selection ratio in regard to the mask insulating film pattern and the insulating film spacer.

7. The method according to claim 6, wherein the perfluorocarbon containing gas is selected from the group consisting of $C_2F_6$, $C_2F_4$, $C_3F_6$, $C_3F_8$, $C_4F_6$, $C_4F_8$, $C_5F_8$, $C_5F_{10}$, $C_2HF_5$, and combinations thereof.

8. The method according to claim 6, wherein the planarization film is etched by using a mixed gas as an etching gas, the mixed gas comprising perfluorocarbon containing gas and an inert gas.

9. The method according to claim 6, wherein the planarization film is etched by using a mixed gas as an etching gas, the mixed gas comprising perfluorocarbon containing gas and a hydrogen containing gas.

10. The method according to claim 9, wherein the hydrogen containing gas is selected from the group consisting of $CHF_3$, $CH_3F$, $CH_2F_2$, $CH_2$, $CH_4$, $C_2H_4$, $H_2$, and mixtures thereof.

11. The method according to claim 9, wherein the mixed gas further comprises an inert gas.

12. The method according to claim 1, wherein the planarization film is etched by using CxHyFz gas ($x \geq 2$, $y \geq 2$, $z \geq 2$) as an etching gas in order to obtain a high etching selection ratio in regard to the mask insulating film pattern and the insulating film spacer.

13. The method according to claim 12, wherein the planarization film is etched by using a mixed gas of the CxHyFz gas ($x \geq 2$, $y \geq 2$, $z \geq 2$) and an inert gas as an etching gas.

14. The method according to claim 1, wherein the contact hole comprises at least one of a bit line contact hole and a storage electrode contact hole.

* * * * *